(12) United States Patent
Jordan et al.

(10) Patent No.: US 9,685,932 B2
(45) Date of Patent: Jun. 20, 2017

(54) APPARATUS AND METHODS FOR ENHANCING BANDWIDTH IN TRENCH ISOLATED INTEGRATED CIRCUITS

(71) Applicant: Analog Devices, Inc., Norwood, MA (US)

(72) Inventors: Edward P. Jordan, Kernersville, NC (US); Jonathan Glen Pfeifer, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/713,338

(22) Filed: May 15, 2015

(65) Prior Publication Data

US 2016/0336920 A1  Nov. 17, 2016

(51) Int. Cl.
*H03H 7/24* (2006.01)
*H03H 11/24* (2006.01)
*H01L 27/06* (2006.01)

(52) U.S. Cl.
CPC ....... *H03H 11/245* (2013.01); *H01L 27/0629* (2013.01)

(58) Field of Classification Search
CPC .......... H03H 7/24; H03H 7/255; H03H 7/253; H03H 7/256; H03H 11/24; H03H 11/245
USPC ...................... 333/81 R, 81 A; 327/308, 309
See application file for complete search history.

(56) References Cited

U.S. PATENT DOCUMENTS

| | | | |
|---|---|---|---|
| 3,893,147 A | 7/1975 | Williams et al. | |
| 5,965,930 A | 10/1999 | Sakamoto et al. | |
| 7,141,485 B2 | 11/2006 | Su et al. | |
| 8,098,088 B1 * | 1/2012 | Sutandi | H03K 17/102 327/108 |
| 8,178,947 B2 | 5/2012 | Takahashi et al. | |
| 8,569,816 B2 | 10/2013 | Shroff et al. | |
| 8,575,717 B2 | 11/2013 | Yeh et al. | |
| 8,835,977 B2 | 9/2014 | Bobde et al. | |

\* cited by examiner

*Primary Examiner* — Stephen E Jones
(74) *Attorney, Agent, or Firm* — Knobbe, Martens, Olson & Bear, LLP

(57) ABSTRACT

Provided herein are apparatus and methods for enhancing bandwidth in trench isolated integrated circuits. In certain configurations, an auxiliary trench forming floating regions between moat isolation regions can isolate parasitic sidewall capacitances of active device regions from ground or AC ground. In this manner the active device regions are merged by the auxiliary trench so as to improve circuit bandwidth and enhance circuit performance. When arranged or combined within a circuit branch, transistors within each floating moat can operate with relatively small parasitic displacement current and can have improved performance.

26 Claims, 5 Drawing Sheets

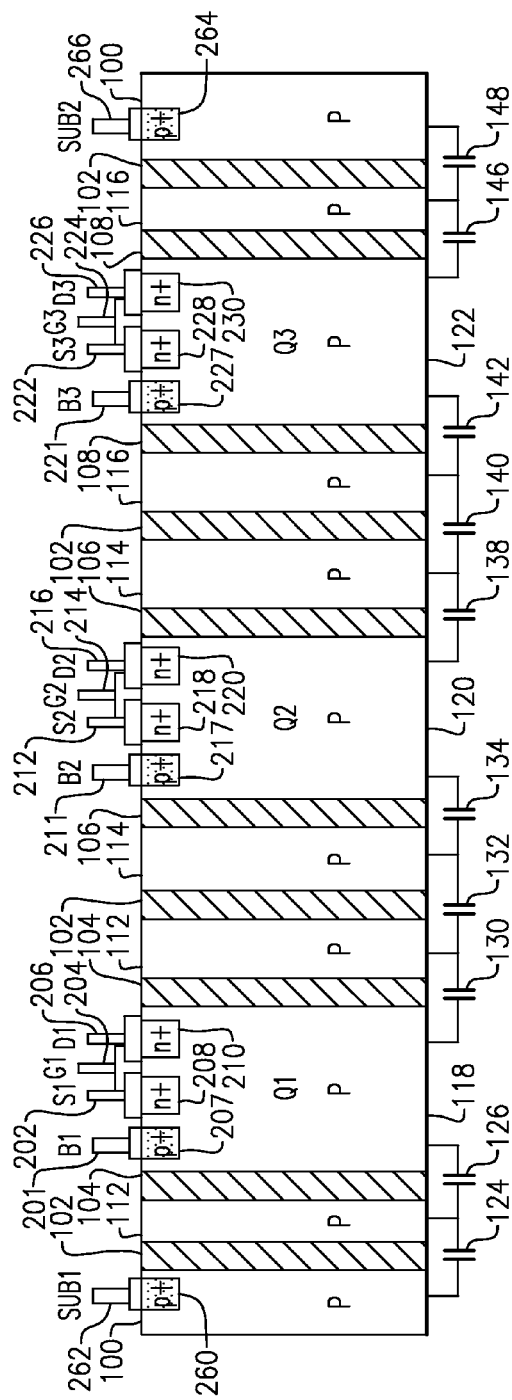
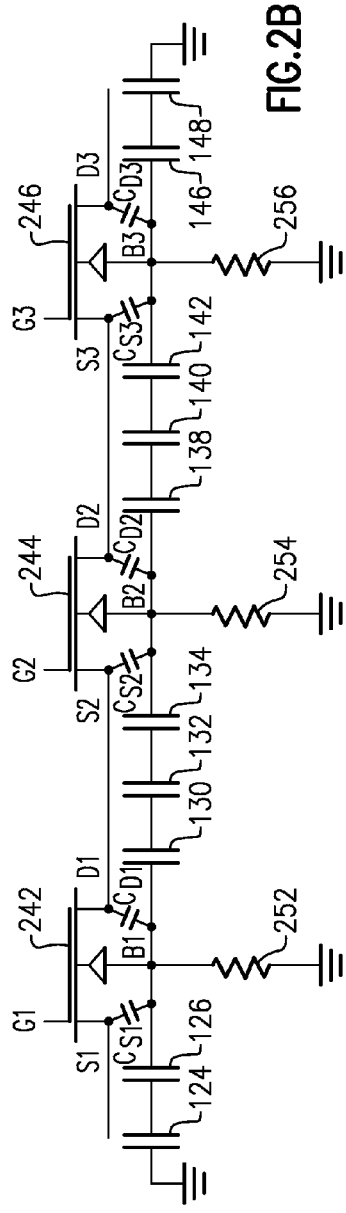
FIG.2A
FIG.2B

APPARATUS AND METHODS FOR ENHANCING BANDWIDTH IN TRENCH ISOLATED INTEGRATED CIRCUITS

BACKGROUND

Field

Embodiments of the invention relate to trench isolated integrated circuit structures, and more particularly, to the layout of active components in trench isolated integrated circuits.

Description of the Related Technology

Integrated circuits can be fabricated using a trench process. In a trench process the active semiconductor devices, such as transistors, are electrically isolated within a region of active silicon surrounded by insulation filled trenches.

Trench isolated integrated circuits find application in high voltage back-light display products requiring transistors capable of sustaining over one hundred volts. In another application, trench isolated integrated circuits are used to create power factor correction boost regulators for generating high voltages.

SUMMARY

One aspect of this disclosure is an attenuator device comprising a substrate that is coupled to a reference voltage and having a first active device and a second active device. The first active device is formed in a first active device region of the substrate and is surrounded by a first trench isolation structure; the second active device is formed in a second active device region and is surrounded by a second trench isolation structure. A third trench isolation region is interposed between the first and second active device regions to define a first and a second floating region of the substrate. There is a first capacitance between the first active device region and the first floating region and a second capacitance between the first floating region and the second floating region; also there is a third capacitance between the second floating region and the second active device region. The first active device has a first operating voltage, and the second active device has a second operating voltage. The difference between the first and second operating voltages can be less than the difference between the first operating voltage and the reference voltage.

In another aspect an attenuator device comprises a substrate, a first active device, and a second active device. The substrate is coupled to a reference voltage. The first active device is formed in a first active device region of the substrate and surrounded by a first trench isolation structure; and the second active device is formed in a second active device region and surrounded by a second trench isolation structure. Additionally, a third trench isolation region is interposed between the first and second active device regions to define a first and a second floating region of the substrate. There is a first capacitance between the first active device region and the first floating region, a second capacitance between the first floating region and the second floating region, and a third capacitance between the second floating region and the second active device region. The attenuator device further comprises an isolation well that surrounds the first and second floating regions and is separated from the first and second floating regions by the third isolation region. The first and second floating regions are merged via the third isolation region.

In a third aspect an integrated circuit comprises a plurality of moat isolation trenches and an auxiliary trench. The auxiliary trench delineates a plurality of active device regions while the auxiliary trench delineates a plurality of floating wells. Both the plurality of active device regions and the plurality of floating wells are isolated. Each of the plurality of active device regions is surrounded by one floating well from the plurality of active device regions. The integrated circuit further comprises an isolation well which is configured to receive a first potential. Additionally, the each of the plurality of moat isolation trenches delineates an inner boundary of one floating well from the plurality of floating wells. The auxiliary trench is patterned to reduce a sidewall capacitance of each active device region by isolating a sidewall capacitance of each active device region from the isolation well.

BRIEF DESCRIPTION OF THE DRAWINGS

These drawings and the associated description herein are provided to illustrate specific embodiments of the invention and are not intended to be limiting.

FIG. 2A is a partial cross section of a trench isolated integrated circuit according to another embodiment.

FIG. 2B is a schematic diagram representing the active and parasitic components of a trench isolated integrated circuit according to the embodiment of FIG. 2A.

DETAILED DESCRIPTION OF EMBODIMENTS

Figure 1:
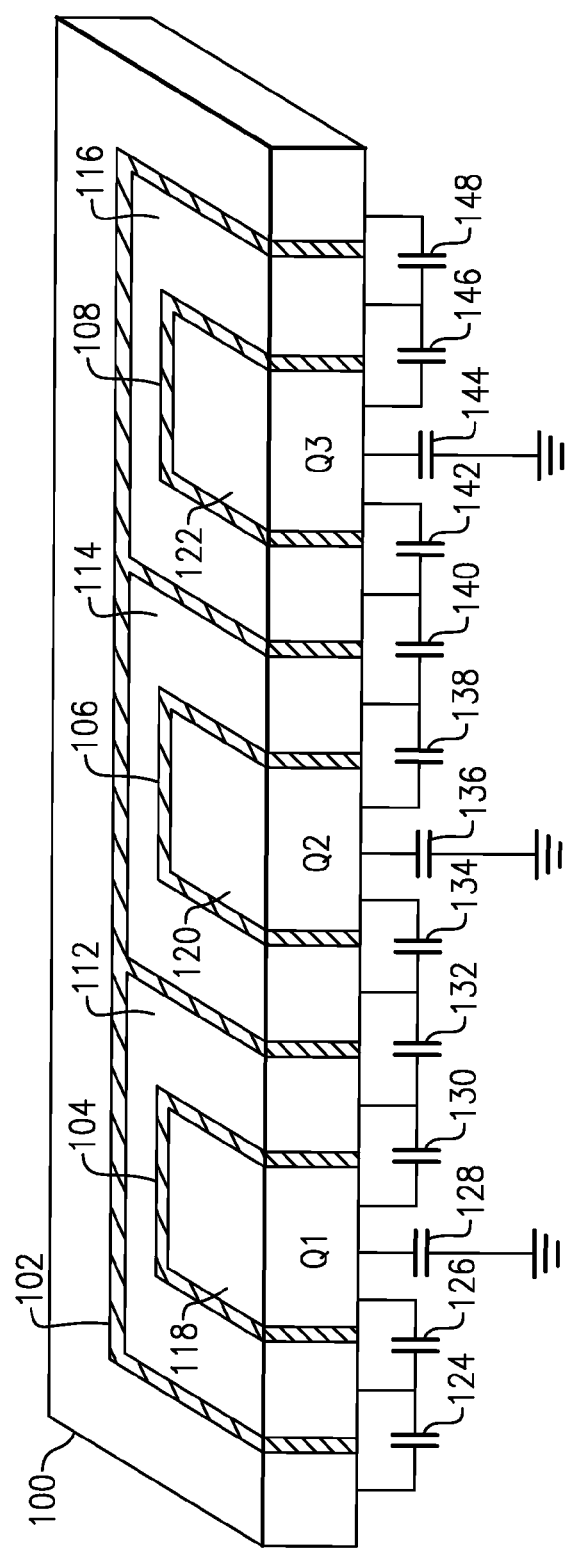
FIG. 1 is a partial cross section of a trench isolated integrated circuit in accordance with the teachings herein.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

In modern trench isolated integrated circuit processes, device capacitances are reduced when compared to junction isolated processes. Many processes use bonded wafers to lower the vertical capacitance in devices. The devices of interest are transistors such as field effect transistors (FET's) and bipolar junction transistors (BJT's) used to create a circuit. The device capacitances directly influence the performance, namely the bandwidth, of the circuit.

When the trench isolated integrated circuit uses an additional wafer to form a "handle", then a vertical component of the device capacitances can be separated from ground or an AC-ground by the resistance of the handle. When the handle resistance is large, the effect of the vertical capacitance can be relatively small compared to the effect of a sidewall capacitance.

The sidewall capacitance, defined by the lateral capacitance between devices, or transistors, can become large when a large number of devices, or transistors, are arranged to form a circuit. For instance, many transistors can be placed in series within a circuit branch to create a multi-transistor series attenuator. In the multi-transistor series attenuator, the sidewall capacitance from each device contributes to a total sidewall capacitance. When this device is connected to the outside world with a wirebond, a lowpass filter is formed with the series inductance of the wirebond and the sidewall capacitance of the devices in the attenuator. This in turn lowers the bandwidth of circuit. Thus, the bandwidth of the multi-transistor series attenuator can be affected by a total capacitance of each transistor's sidewall capacitance.

Unfortunately, in modern trench isolated integrated circuit processes, the handle resistance is not in series with the lateral sidewall resistance, and the total sidewall capacitance to ground or to AC-ground can become large, thereby significantly degrading the bandwidth and circuit performance. Therefore, there is a need to develop an alternative approach to using handle resistance for improving bandwidth.

Provided herein are apparatus and methods for enhancing bandwidth in trench isolated integrated circuits. By surrounding devices with floating wells formed using additional trenches, the sidewall or lateral component of capacitance can be reduced to acceptable levels to improve circuit bandwidth.

FIG. 1 is a partial cross section of a trench isolated integrated circuit in accordance with the teachings herein. The partial cross section shows a portion of an integrated circuit substrate having a first active device region 118, a second active device region 120, and a third active device region 122. Within the first active device region 118 a first transistor Q1 can be formed using an integrated circuit (IC) fabrication process. Similarly, within the second active device region 120 a second transistor Q2 can be formed, and within the third active device region 122 a third transistor Q3 can be formed. In this case the fabrication process is a trench-isolation IC fabrication process availing the formation of deep trenches with insulating properties. The partial cross section has a first moat isolation trench 104, a second moat isolation trench 106, and a third moat isolation trench 108. The first moat isolation trench 104 delineates the first active device region 118 and electrically isolates the first transistor Q1. Similarly the second moat isolation trench 106 delineates the second active device region 120; and the third moat isolation trench 108 delineates the third active device region 122.

Although FIG. 1 shows a practical embodiment wherein the first through third transistors Q1-Q3 have just one surrounding moat isolation trench, other embodiments are possible. For instance, in addition to having the first isolation trench 104 completely surrounding the first active device region 118, the first transistor Q1 can have one or more additional surrounding moat isolation trenches. In this way the first transistor can have a double- or multi-trench isolation pattern surrounding the first active device region 118. Those of ordinary skill in the art can appreciate the concept of having one or more moat isolation trenches to form an active region.

According to the teachings herein, an auxiliary trench 102, unlike that of a moat isolation trench, is patterned so as to form a first floating well 112, a second floating well 114, and a third floating well 116. This pattern merges the devices such that floating regions are formed. In general, a floating well can be a p-type or an n-type well of silicon with no contacts, such that an electric potential of the floating well is not controlled by an external connection. The floating well forms a circuit node which is not connected with a contact or metal connection. As shown in FIG. 1, the first floating well 112 surrounds the first active device region 118 and is located between the auxiliary trench 102 and the first moat isolation trench 104. Similarly, the second floating well 114 surrounds the second active device region 120 and is located between the auxiliary trench 102 and the second moat isolation trench 106; and the third floating well 116 surrounds the third active device region 122 and is located between the auxiliary trench 102 and the third moat isolation trench 108. Surrounding the auxiliary trench 102 is an isolation well 100. The isolation well 100 can be connected to ground or to another potential depending upon the doping, n-type or p-type, of the isolation well 100. Contacts can be formed during the integration process steps in order to connect the isolation well 100 to ground or to another potential.

With respect to FIG. 1, the concept of merged devices can be defined by the introduction of the auxiliary trench 102 which is patterned to form the floating regions. Unlike a double- or multi-isolation trench, the auxiliary trench is a fully connected pattern which delineates the boundaries of the first floating well 112, the second floating well 114, and the third floating well 116.

Those of ordinary skill in the art would appreciate that a merged trench pattern as such is different from a double- or multi-trench trench isolation pattern which completely surrounds a transistor. For instance, as shown in FIG. 1, the auxiliary trench 102 creates a pattern such that it forms a boundary between the first active region 118 and the second active region 120. The auxiliary trench 102 also forms a boundary between the second active region 120 and the third active region 122.

Parasitic capacitances formed by various device regions can be represented as lumped capacitors as drawn in FIG. 1. For instance, the first active device region 118 can have a vertical capacitance to ground represented by a first vertical parasitic capacitor 128. Similarly, the second active device region 120 can have a vertical parasitic capacitance to ground represented by a second vertical parasitic capacitor 136; and the third active device region 122 can have a vertical parasitic capacitance to ground represented by a third vertical parasitic capacitor 144.

In addition there are lateral parasitic capacitances associated with the trench regions which can also be represented as lumped capacitors. For instance, a first sidewall parasitic capacitor 124 represents a capacitance of the auxiliary trench 102 between the isolation well 100 and the first floating well 112. This representation is based upon material properties of the auxiliary trench 102 forming a dielectric between the isolation well 100 and the first floating well 112. Similarly, a second sidewall parasitic capacitor 126 represents a capacitance of the first moat isolation trench 104 between the first floating well 112 and the first active device region 118. Also, by symmetry a third sidewall parasitic capacitor 130 represents a capacitance of the first moat isolation trench 104 between the first active device region 118 and the first floating well 112. Continuing along the partial cross section of FIG. 1, a fourth sidewall parasitic capacitor 132 represents a capacitance of the auxiliary trench 102 between the first floating well 112 and the second floating well 114. A fifth sidewall parasitic capacitor 134 represents a capacitance of the second moat isolation trench 106 between the second floating well 114 and the second active device region 120. In general, lumped capacitors can be drawn to represent parasitic capacitance of each trench segment of the partial cross section of FIG. 1; therefore, in the interest of avoiding repetition, the remaining drawn lumped capacitances are identified as follows: a sixth sidewall parasitic capacitor 138, a seventh sidewall parasitic capacitor 140, an eighth sidewall parasitic capacitor 142, a ninth sidewall parasitic capacitor 146, and a tenth sidewall parasitic capacitor 148.

Having the auxiliary trench and the first floating well 112, the second floating well 114, and the third floating well 116, can advantageously improve device performance by virtue of series connected sidewall parasitic capacitances. When transistors of the active device regions are combined within a circuit branch, parasitic capacitances of each active device region can contribute to a total parasitic capacitance. As shown in FIG. 1, parasitic sidewall capacitors are placed in series, which not only advantageously reduces total parasitic capacitance but also reduces displacement currents to AC ground. For one, series connected capacitors reduces net capacitance. By way of example, two capacitors in series having equal capacitance C exhibit a reduced net capacitance of one-half C. Secondly, when signal voltages of active device regions are similar, then having parasitic sidewall capacitors in series reduces parasitic displacement current to AC ground by isolating sidewall capacitance from AC ground.

Although the partial cross section of FIG. 1 shows the trench isolated IC as having three active device regions, other embodiments having fewer or greater active device regions are possible.

FIG. 2A is a partial cross section of a trench isolated integrated circuit according to another embodiment. The partial cross section can be an embodiment of the partial cross section of FIG. 1 with more detail provided to well diffusion type, p-type or n-type, and to active device region transistor type, namely BJT or CMOS transistor. Also, in FIG. 2A well diffusions are shown as being p-type. For instance, the isolation well 100 is p-type. The first floating well 112, the second floating well 114, and the third floating well 116 are p-type. Also, the first active device region 118, the second active device region 120, and the third active device region 122 have p-type wells. Although the embodiment of FIG. 2A shows an embodiment having p-type wells, other embodiments are possible. For instance, the isolation wells could be n-type. Further, one of ordinary skill in the art can appreciate that different transistors having different diffusion types, either p-type or n-type, are possible.

In FIG. 2A each active device region contains an NMOS transistor. Within the first active device region 118 a first NMOS transistor Q1 has an N+ diffused source 208 with a source contact S1 202 and an N+ diffused drain 210 with a drain contact D1 206. The N+ diffused source 208 and drain 210 are diffused into the p-type well which forms a body of the first NMOS transistor Q1. Also diffused into the p-type well is a P+ diffusion 207 with a body contact B1 201. The gate contact G1 204 provides the connection to the gate of the first NMOS transistor Q1. Similarly within the second active device region 120 a second NMOS transistor Q2 is formed with an N+ diffused source 218 and an N+ diffused drain 220 within a p-type well forming a body having a P+ diffusion 217. The second NMOS transistor Q2 also has a source contact S2 212, a gate contact G2 214, a drain contact D2 216, and a body contact B2 211. And within the third active device region 122 a third NMOS transistor Q3 is formed with an N+ diffused source 228 and an N+ diffused drain 230 within a p-type well forming a body having a P+ diffusion 227. The third NMOS transistor Q3 also has a source contact S3 222, a gate contact G3 224, a drain contact D3 226, and a body contact B3 221.

In the embodiment of FIG. 2A, the first floating well 112, the second floating well 114, and the third floating well 116 can be processed without contacts and metallization. The isolation well 100, on the other hand, can have contacts making an electrical connection to ground or to a first potential. In FIG. 2A the isolation well 100 has a P+ diffused region 260 having a first substrate contact SUB1 262 and a P+ diffused region 264 having a second substrate contact SUB2 266. Both the first substrate contact SUB1 262 and the second substrate contact SUB2 266 can be connected to ground or to a DC potential. In addition, although FIG. 2A shows the isolation well 100 as having a first substrate contact SUB1 262 and a second substrate contact SUB2 266, other configurations are possible and the isolation well 100 can have fewer or greater substrate contacts.

Similar to that of FIG. 1, the partial cross section of FIG. 2A shows the trench isolated IC as having three active device regions with NMOS transistors; however embodiments having fewer or greater active device regions are possible. Further, other transistor types including NPN BJT's, PNP BJT's, or PMOS transistors can be processed instead of NMOS transistors. Additionally, well diffusions can be n-type and the isolation well 100 can be connected to a DC potential other than ground.

FIG. 2B is a schematic diagram representing the active and parasitic components of a trench isolated integrated circuit according to the embodiment of FIG. 2A. The trench isolated IC of FIG. 2B can represent the schematic diagram of the trench isolated IC of FIG. 2A where a first NMOS 242, a second NMOS 244, and a third NMOS 246 correspond to the first NMOS Q1, the second NMOS Q2, and the third NMOS Q3 of FIG. 2A, respectively. FIG. 2B shows a connection of NMOS transistors in series such that the drain contact D1 of the first NMOS transistor 242 is electrically connected to the source contact S2 of the second NMOS transistor 244 and such that the drain contract D2 of the second NMOS transistor 244 is electrically connected to the source contact S3 of the third NMOS 246 transistor.

In FIG. 2B a resistor 252 is electrically connected between the body contact B1 and ground. Similarly a resistor 254 is electrically connected between the body contact B2 and ground; and a resistor 256 is electrically connected between the body contact B3 and ground. The resistor 252, the resistor 254, and the resistor 256 are external and operate to apply ground potential to their respective body contacts. For instance, the resistor 252 provides a ground potential from ground to the body contact B1. In addition the first substrate contact SUB1 and the second substrate contact SUB2 are electrically connected to ground. A first source-to-body capacitor CS1 represents a parasitic capacitance between the source contact S1 and the body contact B1 while a first drain-to-body capacitor CD1 represents a parasitic capacitance between the drain contact D1 and the body contact B1. Similarly, a second source-to-body capacitor CS2 represents a parasitic capacitance between the source contact S2 and the body contact B2 while a second drain-to-body capacitor CD2 represents a parasitic capacitance between the drain contact D2 and the body contact B2. Finally, a third source-to-body capacitor CS3 represents a parasitic capacitance between the source contact S3 and the body contact B3 while a third drain-to-body capacitor CD3 represents a parasitic capacitance between the drain contact D3 and the body contact B3.

In the embodiment of FIG. 2B, the resistors 252-256 can have a high value, such as 1 megohm, so as to provide a high resistance body connection. As one of ordinary skill in the art can appreciate, other embodiments are possible depending on the type of wafer bonding used in fabricating the integrated circuit. For instance, the resistors 252-256 can be excluded depending on the type of wafer bonding. In some embodiments, a large parasitic body resistance can be present and can be in contact with a parasitic capacitance between a substrate or handle and a body well.

Because the first substrate contact SUB1 and the second substrate contact SUB2 connect to ground, the first sidewall capacitor 124 and the tenth sidewall capacitor 148, representing capacitances associated with the isolation well 100, connect to ground. Having the first NMOS 242, the second NMOS 244, and the third NMOS 246 arranged in series causes the first sidewall capacitor 124 through the tenth sidewall capacitor 148 to be arranged in series.

In addition, having floating wells with no connection to ground isolates the remaining sidewall capacitor nodes from the isolation well 100; therefore, the remaining sidewall capacitor nodes are isolated from ground. Other than the ground connections of the first sidewall capacitor 124 and the tenth sidewall capacitor 148, the remaining sidewall capacitors are arranged in series with nodes isolated from ground by virtue of the floating wells and by virtue of the resistor 252, the resistor 254, and the resistor 256. When the resistor 252, the resistor 254, and the resistor 256 have relatively high impedance, then the body connections B1, B2, and B3 can be relatively isolated from ground. In this way a signal coupled from the first NMOS 242, the second NMOS 244, and the third NMOS 246 can advantageously be isolated from ground. Being isolated from the ground potential, the signal coupled from the first NMOS 242, the second NMOS 244, and the third NMOS 246 can propagate with relatively low loss to ground.

In addition, because the first NMOS 242, the second NMOS 244, and the third NMOS 246 are arranged in series, signals located within the series arrangement can have similar waveforms. For instance, a signal coupled from the first NMOS 242 will have a similar waveform to a signal coupled from the second NMOS 244. This in turn can reduce displacement currents associated with the first through tenth sidewall capacitors 124-148.

Also, in embodiments using active devices such as PMOS and/or having an isolation well with n-type doping, a DC potential other than ground can be connected to the isolation well 100. In this case a DC potential can represent an AC ground and the benefits of isolating a sidewall capacitance from AC ground can be equivalent to the benefits of isolating a sidewall capacitance from ground.

Figure 3A:
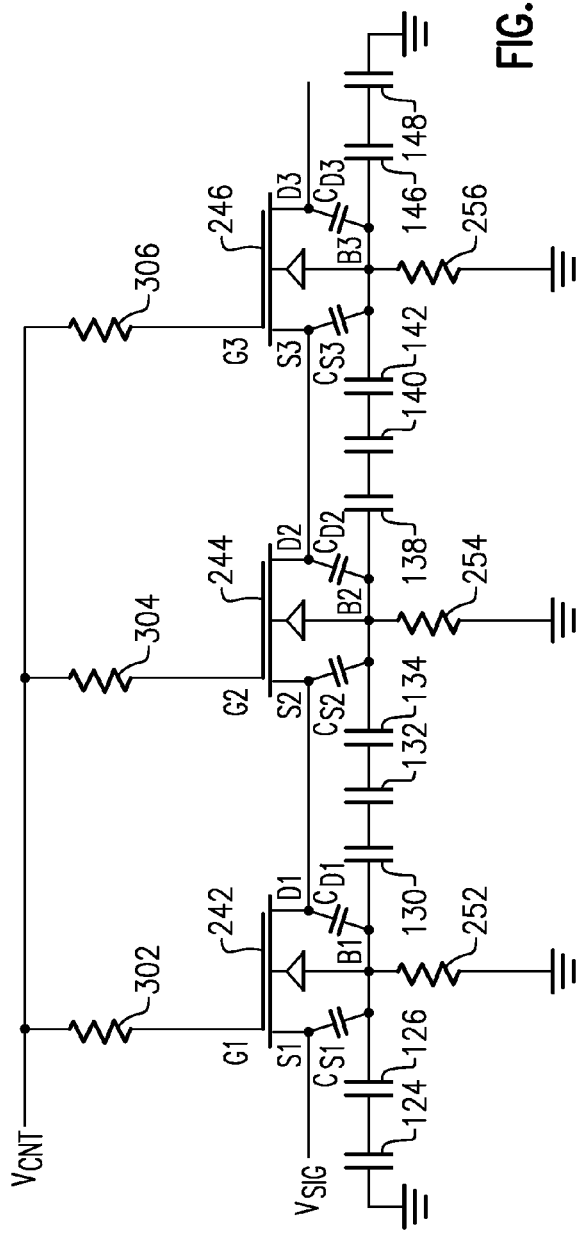
FIG. 3A is a schematic diagram representing the active and parasitic components of a trench isolated integrated circuit according to another embodiment.

FIG. 3A is a schematic diagram representing the active and parasitic components of a trench isolated integrated circuit according to another embodiment. FIG. 3A can represent an application of FIG. 2B operating with a gate control voltage $V_{CNT}$ at a control node and receiving an input signal $V_{SIG}$ at the source contact S1. A first gate resistor 302 is electrically connected between the gate contact G1 and the control node. A second gate resistor 304 is electrically connected between the gate contact G2 and the control node, and a third gate resistor 306 is electrically connected between the gate contact G3 and the control node.

Figure 3B:
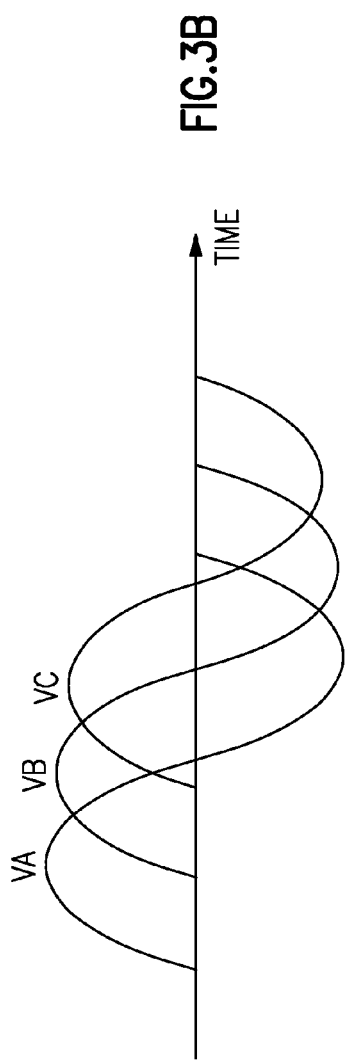
FIG. 3B is a voltage waveform vs. time for three voltage nodes according to the embodiment of FIG. 3A.

FIG. 3B is a voltage waveform vs. time for three voltage nodes according to the embodiment of FIG. 3A. The gate control voltage $V_{CNT}$ can be an analog voltage or a digital voltage. When the gate control voltage $V_{CNT}$ exerts a digital or analog voltage between a logic low and a logic high, the input signal $V_{SIG}$ propagates along the branch from the source contact S1 to the drain contact D3 through the first NMOS 242, the second NMOS 244, and the third NMOS 246. FIG. 3B shows waveforms at different points between the source contact S1 and the drain contact D3. Here a voltage VA waveform can represent a voltage signal at the drain contact D1. A voltage VB waveform can represent a voltage signal at the drain contact D2, and a voltage VC waveform can represent a voltage signal at the drain contact D3. The voltage VA waveform can couple to the body contact B1 via the first drain-to-body capacitor CD1. Similarly, the voltage VB can couple to the body contact B2 via the second drain-to-body capacitor CD2, and the voltage VC can couple to the body contact B3 via the third drain-to-body capacitor CD3.

Advantageously, displacement currents of the sidewall capacitors can be relatively low because the voltage waveforms VA-VC have similar voltage swings. For instance, a voltage difference between the body contact B1 and the body contact B2 can be related to the voltage difference between the voltage waveform VA and the voltage waveform VB. Because these waveforms have a small differential value, the displacement current across the series arrangement of the sidewall capacitor 130, the sidewall capacitor 132 and the sidewall capacitor 134 can be relatively small. Therefore, an additional reduction in displacement current can be achieved with floating wells when the active devices are combined in a manner, as shown above, such that the signals have small differential voltage variation across the sidewall capacitors.

Figure 4:
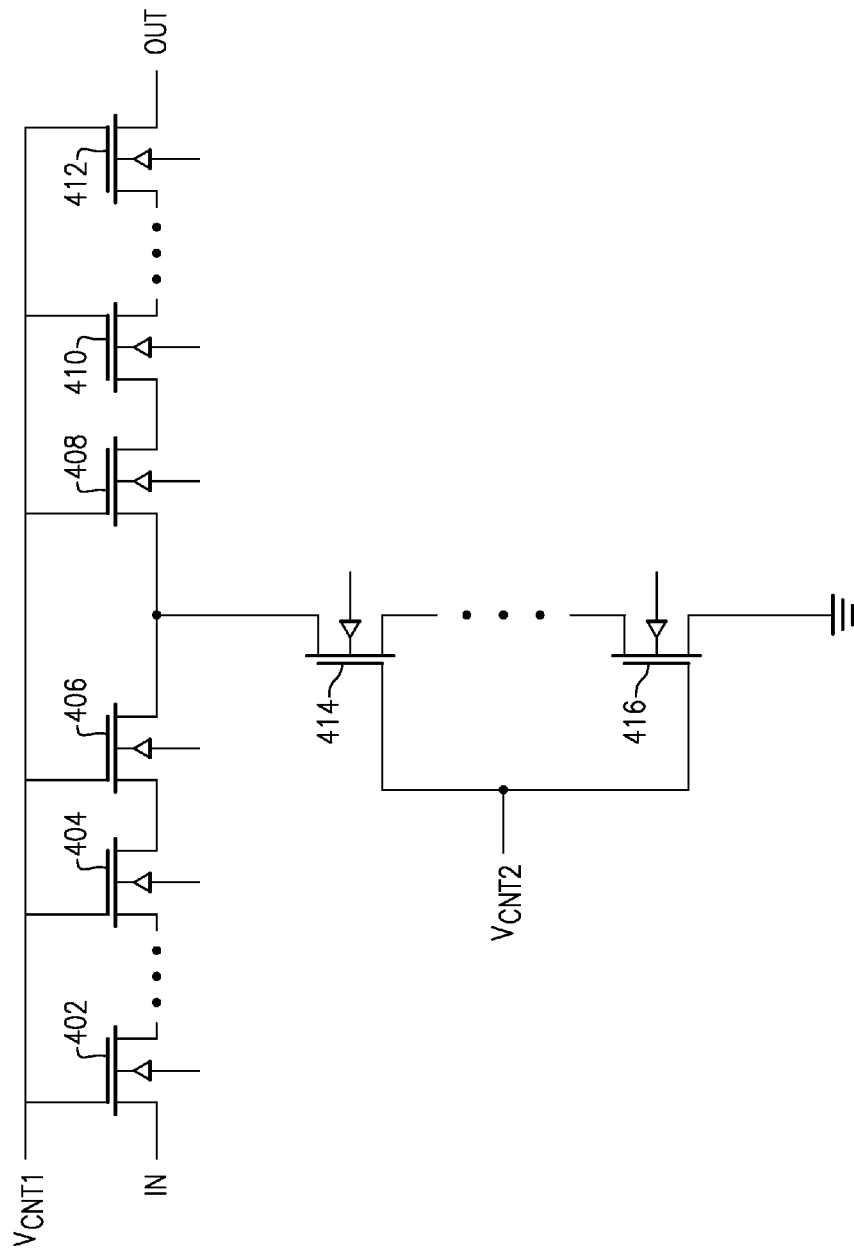
FIG. 4 is a schematic diagram of active components of a trench isolated integrated circuit according to another embodiment.

FIG. 4 is a schematic diagram of active components of a trench isolated integrated circuit according to another embodiment. This embodiment shows an arrangement of active devices which benefit from using floating wells such as those shown in FIG. 2A. FIG. 4 is a T-type attenuator having a first plurality of NMOS devices 402-412 arranged in series between an input IN and an output OUT. The T is formed with a second plurality of NMOS devices 414-416 between a central node and ground. The central node is formed by the connection of the NMOS 406, the NMOS 414, and the NMOS 408. When the first plurality of NMOS devices 402-412 and the second plurality of NMOS devices 414-416 are arranged in an integrated circuit using the techniques of FIG. 2A, then signals from the input IN to the output OUT can propagate with relatively low displacement current loss. Displacement current is reduced for the reasons discussed with regards to FIG. 2A and FIG. 3A. For one, sidewall capacitance is reduced by having a series arrangement. Secondly, sidewall capacitors are isolated from ground. Thirdly, signals of the device arrangement provide relatively small voltage variations across the sidewall capacitors; thereby causing relatively small displacement currents.

Although FIG. 4 shows an embodiment of a T-type attenuator, other circuit embodiments are possible. For instance, instead of forming a T-type attenuator, active devices can be used to form other attenuator types. Other attenuator types can include a pi-type, a bridged T-type, or a hybrid-pi type. Also, one of ordinary skill in the art would appreciate that NMOS devices can be replaced with PMOS devices to realize PMOS embodiments of attenuators and circuits.

Figure 5:
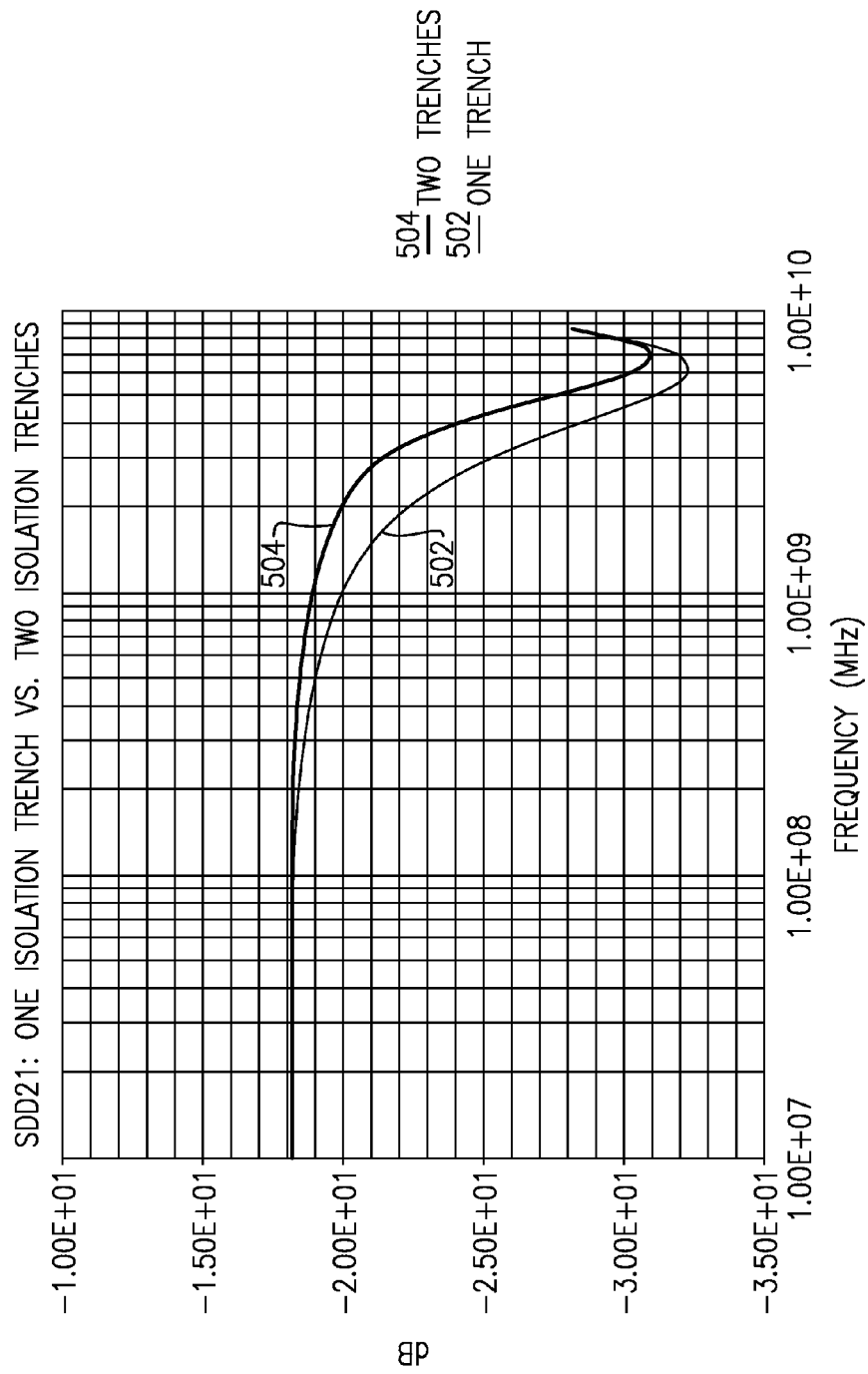
FIG. 5 is a gain in decibels of an integrated circuit using one isolation trench region without floating wells and of an integrated circuit using two isolation trench regions with floating wells in accordance with the teachings herein.

FIG. 5 is a gain in decibels of an integrated circuit using one isolation trench region without floating wells 502 and of an integrated circuit using two isolation trench regions with floating wells 504 in accordance with the teachings herein. In comparing the integrated circuit using one isolation trench region without floating wells 502 and the integrated circuit using trench regions with floating wells 504, the experimental attenuation setting is fixed; and in both cases, using one isolation trench region without floating wells 502 and using two isolation trench regions with floating wells

504, active devices where arranged into a T-attenuator such as that shown in FIG. 4. The desired goal of higher bandwidth is achieved in the case using two isolation trench regions with floating wells 504. This corresponds to having active devices arranged similar to that of FIG. 2A, and the benefits of reduced sidewall capacitance, similar voltage swings, and isolation from ground allow the bandwidth to extend further than in the case using one isolation trench region without floating wells 502.

APPLICATIONS

Devices employing the above described trench isolated active devices with floating wells can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An attenuator device comprising:
a substrate that is coupled to a reference voltage;
a first device formed in a first device region of the substrate wherein the first device region is surrounded by a first trench isolation structure;
a second device formed in a second device region wherein the second device is surrounded by a second trench isolation structure;
a third trench isolation region, the first and second device regions and the third trench isolation region are positioned to define a first and a second floating region of the substrate such that there is a first capacitance between the first device region and the first floating region and a second capacitance between the first floating region and the second floating region and a third capacitance between the second floating region and the second device region;
wherein the first device has a first operating voltage and the second device has a second operating voltage and wherein the difference between the first and second operating voltages is less than the difference between the first operating voltage and the reference voltage.

2. The device of claim 1, wherein the first and second floating regions are merged across the third trench isolation region such that the error current across the first, second and third capacitances is reduced.

3. The device of claim 1, wherein the first and second devices are transistors.

4. The device of claim 3, wherein the device comprises an attenuator, wherein each of the transistors attenuate an input signal.

5. The device of claim 1, wherein the first, second and third capacitances are connected in series.

6. The device of claim 1, further comprising an isolation well that surrounds the first and second floating regions and is separated from the first and second floating regions by the third isolation region.

7. The device of claim 1, wherein the reference voltage is ground.

8. An attenuator device comprising:
a substrate that is coupled to a reference voltage;
a first device formed in a first active device region of the substrate wherein the first device region is surrounded by a first trench isolation structure;
a second device formed in a second device region wherein the second device is surrounded by a second trench isolation structure;
a third trench isolation region, the first and second device regions and third trench isolation region are positioned to define a first and a second floating region of the substrate such that there is a first capacitance between the first device region and the first floating region and a second capacitance between the first floating region and the second floating region and a third capacitance between the second floating region and the second device region; and
an isolation well that surrounds the first and second floating regions and is separated from the first and second floating regions by the third isolation region and wherein the first and second floating regions are merged via the third isolation region.

9. The device of claim 8, wherein the first active device has a first operating voltage and the second device has a second operating voltage and wherein the difference between the first and second operating voltages is less than the difference between the first operating voltage and the reference voltage.

10. The device of claim 8, wherein the first and second floating regions are merged across the third trench isolation region such that the error current across the first, second and third capacitances is reduced.

11. The device of claim 8, wherein the first and second devices are transistors.

12. The device of claim 11, wherein the device comprises an attenuator, wherein each of the transistors attenuate an input signal.

13. The device of claim 8, wherein the first, second and third capacitances are connected in series.

14. The device of claim 8, further comprising at least one isolation well that surrounds the first and second floating regions and is separated from the first and second floating regions by the third isolation region.

15. An integrated circuit comprising:
a plurality of moat isolation trenches formed within the integrated circuit so as to delineate a plurality of device regions, wherein each of the plurality of device regions is isolated and has at least one device formed therein;
an auxiliary trench formed within the integrated circuit so as to delineate a plurality of floating wells, and each of the plurality of device regions is surrounded by one floating well from the plurality of floating wells, and each of the plurality of floating wells is isolated;
an isolation well configured to receive a first potential;
each of the plurality of moat isolation trenches delineates an inner boundary of one floating well from the plurality of floating wells; and
wherein the auxiliary trench is patterned to reduce a sidewall capacitance of each device region by isolating a sidewall capacitance of each device region from the isolation well.

16. The integrated circuit of claim 15, wherein the plurality of device regions are merged such that a displacement current due to signals between neighboring active device regions is reduced.

17. The integrated circuit of claim 15, wherein the plurality of device regions comprises transistors electrically connected to form a circuit.

18. The integrated circuit of claim 15, wherein the plurality of device regions comprises a first active region having a first transistor and a second active region having a second transistor, wherein the first transistor neighbors the second transistor such that a first floating well and a second floating well are located between the first transistor and the second transistor.

19. The integrated circuit of claim 18, wherein the first floating well and the second floating reduce a sidewall capacitance between the first transistor and the second transistor.

20. The integrated circuit of claim 19, wherein a voltage signal of the first transistor and a voltage signal of the second transistor have commensurate voltage swings such that a displacement current across the neighboring sidewall capacitance between the first transistor and the second transistor is reduced.

21. The integrated circuit of claim 20, wherein the first and the second transistors are NMOS or PMOS transistors electrically connected within an electrical branch of a step attenuator.

22. An integrated circuit comprising:
a plurality of moat isolation trenches formed within the integrated circuit so as to delineate a plurality of device regions, wherein each device region is isolated and has at least one device formed therein;
an auxiliary trench formed within the integrated circuit so as to delineate a floating well, wherein the auxiliary trench surrounds the plurality of device regions, the auxiliary trench being patterned to reduce a sidewall capacitance of each device region.

23. The integrated circuit of claim 22, wherein the auxiliary trench extends between adjacent device regions.

24. The integrated circuit of claim 22, wherein the plurality of device regions comprises a first device region having a first transistor and a second device region having a second transistor, wherein the floating well reduces a sidewall capacitance between the first device region and the second device region.

25. The integrated circuit of claim 24, wherein a voltage signal of the first transistor and a voltage signal of the second transistor have commensurate voltage swings such that a displacement current across the neighboring sidewall capacitance between the first device region and the second device region is reduced.

26. The integrated circuit of claim 25, wherein the first and the second transistors are NMOS or PMOS transistors electrically connected within an electrical branch of a step attenuator.

* * * * *